US008912796B2

(12) United States Patent
Wilhelm et al.

(10) Patent No.: US 8,912,796 B2
(45) Date of Patent: Dec. 16, 2014

(54) NMR MEASURING CONFIGURATION WITH OPTIMIZED SAMPLE CONTAINER GEOMETRY AND METHOD FOR CALCULATING THE SHAPE OF THE SAMPLE CONTAINER

(75) Inventors: Dirk Wilhelm, Maur (CH); Thomas Speck, Thalwil (CH); Oskar Schett, Uster (CH)

(73) Assignee: Bruker BioSpin AG, Faellanden (CH)

(*) Notice: Subject to any disclaimer, the term of this patent is extended or adjusted under 35 U.S.C. 154(b) by 460 days.

(21) Appl. No.: 13/417,260

(22) Filed: Mar. 11, 2012

(65) Prior Publication Data

US 2012/0256632 A1    Oct. 11, 2012

(30) Foreign Application Priority Data

Apr. 11, 2011  (DE) .......................... 10 2011 007 167

(51) Int. Cl.
*G01R 33/30* (2006.01)
*G06F 17/10* (2006.01)
*G01R 33/565* (2006.01)

(52) U.S. Cl.
CPC .......... *G01R 33/30* (2013.01); *G01R 33/56536* (2013.01)
USPC ................. 324/321; 324/318; 703/2

(58) Field of Classification Search
CPC . G01R 33/30; G01R 33/56536; G01R 33/307
USPC ....................... 324/300–322; 703/2
See application file for complete search history.

(56) References Cited

U.S. PATENT DOCUMENTS

| 3,287,630 | A | * | 11/1966 | Gang ............................. 324/320 |
| 4,549,136 | A | | 10/1985 | Zens |
| 5,302,900 | A | | 4/1994 | Cummings |
| 5,831,434 | A | | 11/1998 | Shigezane |
| 7,656,158 | B2 | * | 2/2010 | Fey et al. ...................... 324/321 |
| 2008/0106263 | A1 | * | 5/2008 | Fey et al. ...................... 324/321 |

FOREIGN PATENT DOCUMENTS

JP      06 249 934       9/1994

OTHER PUBLICATIONS

Francoise Roméo et al., "Magnet Field Profiling: Analysis and Correcting Coil Design", Magnetic Resonance in Medicine 1, 44-65 (1984).
Richard R. Ernst, "Measurement and Control of Magnetic Field Homogeneity", The Review of Scientific Instruments, vol. 39, No. 7, Jul. 1968, 998 ff.

(Continued)

*Primary Examiner* — Melissa Koval
*Assistant Examiner* — Rishi Patel
(74) *Attorney, Agent, or Firm* — Paul Vincent

(57) ABSTRACT

A sample container (2) for NMR measurements defines a volume (V) of sample substance. The sample container (2) has a first interface (G1) towards an environment (1) and a second interface (G2) towards the sample substance (3). A susceptibility jump at the second interface G2 is sufficiently large that the maximum value of $|B'_{G2}/B_0|$ within the volume (V) is at least 0.5 ppm. The geometry of the sample container (2) is selected in such a fashion that, when a homogeneous magnetic field $B_0$ has been applied, a location-dependent relative field change F is present in the volume (V), which is larger than 20 ppb at least at one point in a center partial volume (V1) and a first residual field (R1) in the center partial volume (V1) is smaller than 1.6 ppb. A second residual field (R2a) in the lower partial volume (V2a) is smaller than 30 ppb.

18 Claims, 11 Drawing Sheets

(56) References Cited

OTHER PUBLICATIONS

P.C.M. Van Zijl et al., "Optimized Shimming for High-Resolution NMR Using Three-Dimensional Image-Based Field Mapping", Journal of Magnetic Resonance, Series A 111, 203-207 (1994).

Markus Weiger et al., "Gradient shimming with spectrum optimisation", Journal of Magnetic Resonance 182 (2006) 38-48.

* cited by examiner

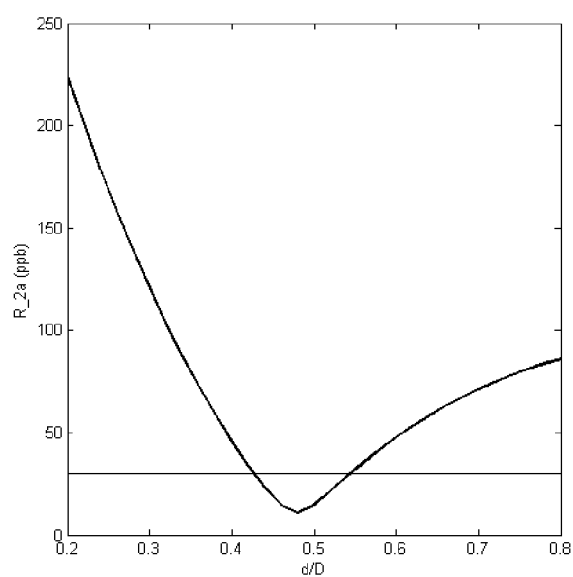 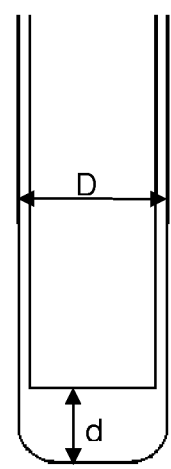
Fig. 12a  Fig. 12b

NMR MEASURING CONFIGURATION WITH OPTIMIZED SAMPLE CONTAINER GEOMETRY AND METHOD FOR CALCULATING THE SHAPE OF THE SAMPLE CONTAINER

This application claims Paris Convention priority of DE 10 2011 007 167.9 filed Apr. 11, 2011 the complete disclosure of which is hereby incorporated by reference.

BACKGROUND OF THE INVENTION

The invention concerns a measuring configuration for NMR measurements, comprising a sample container that is closed on one side, wherein the material of the sample container has a magnetic susceptibility of $\chi_2$, an environment of a magnetic susceptibility of $\chi_1$, in which the sample container is arranged, and a sample substance which is contained in the sample container has a magnetic susceptibility of $\chi_3$, and takes up a volume within the sample container, wherein the volume of the sample substance consists of an upper partial volume, a lower partial volume and a center partial volume which comprises the origin of a spherical coordinate system with a z-axis, wherein the partial volumes adjoin one another, wherein the sample container has a first interface towards the environment and a second interface towards the sample substance, and, for certain designs of the sample container, the sample substance has a further interface between the sample substance and the environment, wherein there are magnetic susceptibility jumps at the interfaces, which cause location-dependent disturbance fields in the volume of the sample substance upon application of a predetermined external homogeneous magnetic field $B_0$ which extends parallel to the z-axis, wherein the susceptibility jump at the second interface is sufficiently large that the maximum value of $|B'_G/B_0|$ within the volume is at least 0.5 ppm, wherein, when a homogeneous magnetic field $B_0$ has been applied, there is a first residual field in the center partial volume and a second residual field in the lower partial volume, with $B_{G1}$: location-dependent z component of the magnetic field that is generated due to the susceptibility jump from $\chi_1$ to $\chi_2$ at the first interface G1;

$B_{G2}$: location-dependent z component of the magnetic field that is generated due to the susceptibility jump from $\chi_2$ to $\chi_3$ at the second interface G2;

$B_{G3}$: location-dependent z component of the magnetic field that is generated due to the susceptibility jump from $\chi_3$ to $\chi_1$ at the further interface G3;

$F := (B'_{G1} + B'_{G2} + B'_{G3})/B_0$: location-dependent relative field change due to the susceptibility jumps at the interfaces G1, G2, G3

$B'_j := B_j - \langle B_j \rangle$: location-dependent deviation of the field $B_j$ from the average value $\langle B_j \rangle$ $\langle B_j \rangle$: Average value of the z component of the field $B_j$, wherein (j=G1, G2, G3)

$$R_1 := \left( \frac{1}{V_1} \int_{V_1} (F - F^N)^2 \, dV \right)^{1/2},$$

first residual field (in the center partial volume (V1));

$$R_{2a} := \left( \frac{1}{V_{2a}} \int_{V_{2a}} (F - F^N)^2 \, dV \right)^{1/2},$$

second residual field (in the lower partial volume (V2a))

$F^N$: Expansion of the relative field change F about the origin of the spherical coordinate system in rotationally symmetrical spherical functions up to order N, wherein N=4 to 10;

wherein the following applies in general:

$$\langle A \rangle := \frac{1}{V} \int_V A \cdot dV;$$

Average value of any magnetic field A in the sample volume V;

$$A^N := \sum_{n=0}^{N} a_n K_n(r, \theta);$$

Expansion of A in rotationally symmetrical (i.e. independent of $\phi$) spherical functions up to order N, with $a_n$:=Expansion coefficients
$K_n(r,\theta) = r^n P_n(\cos \theta)$:=rotationally symmetrical spherical functions
$P_n(\cos \theta)$:=Legendre polynomials A measuring configuration of this type is disclosed in [6], [8].

NMR spectroscopy is a multifunctional tool for the chemical analysis of samples. Towards this end, a sample is disposed in a strong static magnetic field and subjected to electromagnetic pulses. The reaction of the nuclei in the sample is measured and analyzed. The properties of the static magnetic field influence the quality of the measurement results. The best results are generally obtained in a large magnetic field with high homogeneity. Field strengths of up to 23 T are used for high-resolution NMR spectroscopy. Superconducting magnets are used in this connection.

The typical measuring configuration that is used in modern spectrometers consists of a cylindrical superconducting coil that generates a strong magnetic field parallel to the axis in the cylindrical inner space. The cylindrical inner space also contains shim coils, gradients, and radio frequency coils, which are arranged in this inner space at different radii around a sample container. The sample container contains the substance to be examined. It must be made from an electrically insulating and chemically inert material.

The field homogeneity required for high-resolution NMR spectroscopy is of an order of magnitude of parts per billion (ppb). The superconducting magnet coil does generate a magnetic field that is sufficiently strong but is typically not sufficiently homogeneous. The magnetic field requires fine correction in order to obtain the required homogeneity. For this reason, the field homogeneity is normally corrected by means of a shim coil system. The shim coil system provides a number of coils with different geometrical arrangements. Currents in these coils generate magnetic fields in that region receiving the RF coils and the sample container. These magnetic fields are added to the magnetic field of the magnet. When the currents in the coils of the shim coil system are suitably adjusted, a largely homogeneous magnetic field can be obtained. Geometrical arrangements of shim coils in such shim coil systems are described e.g. in [1].

In addition to insufficient basic homogeneity of the magnet, all materials that are introduced into the magnetic field may cause a distortion of the magnetic field due to their magnetic susceptibility. These materials include, in particular, the RF coil and also the sample container and the sample substance itself. These magnetic field inhomogeneities may also be partially compensated for by magnetic fields of the shim coil system.

The process of adjusting the currents in the shim coil system with the aim to obtain as homogeneous a magnetic field as possible, is called shimming. There are different conventional shimming methods, e.g. [2], [3], [4]. All have in common that they receive signals from the sample substance with one of the RF coils during performance of the method, and determine the required current changes in the shim coils. For this reason, shimming takes into consideration only that volume portion of the sample substance that is in the sensitive area of the RF coil.

The coils of the shim coil system, which are rotationally symmetrical with respect to the magnet axis, play a particular role. They generate magnetic fields that are described by the rotationally symmetrical spherical functions.

They are required for shimming rotationally symmetrical field deviations.

The sample container may have different shapes in dependence on the application. A typical shape is a long rotationally symmetrical cylinder. There are two essential reasons for selecting a rotationally symmetrical cylindrical shape. Firstly, the cylindrical geometry generates magnetic disturbances, i.e. deterioration of the homogeneity of the static magnetic field ($B_0$), only at the two ends. Secondly, rotationally symmetrical sample containers can be rotated during measurement and for this reason, one can average non-rotationally symmetrical field inhomogeneities with time. Their influence on the measurement result is thereby reduced.

In a configuration of this type, typically only half of the sample volume, namely the part located in the highly sensitive area of the radio frequency coil, substantially contributes to the measured signal. The additional sample substance is used to reduce the magnetic disturbances at the upper and lower borders of the sample volume. This additional sample substance has the following disadvantages: When there is only little sample substance available, the sample substance must be diluted to the required volume. This reduces, however, the measurement sensitivity in the highly sensitive area of the radio frequency coil.

The area of additional sample substance may also generate undesired NMR signals such as e.g. with respect to the problems of suppressing the solvent. The NMR signal of the substance to be examined (useful signal, e.g. of a protein) is often weaker by several orders of magnitude than that of the solvent (e.g. water). In this case, it is often not possible in terms of measurement technology to detect the weak signals in the presence of the undesirably strong solvent signal. The solvent signal can be suppressed by suitable pulse sequences. Since the solvent suppression in the upper and lower partial volumes is less efficient, solvent signals from these volumes may become considerably larger than the useful signal (NMR signal of the nuclei to be examined).

Both problems can be eased by reducing the magnetic disturbance of the ends of the sample container. Smaller magnetic disturbances allow the ends to be positioned closer to the highly sensitive area of the coil. This reduces, in turn, the region of additional sample substance. There are three conventional strategies for this reduction:

1. Adjustment of the magnetic susceptibility of the sample container to that of the sample substance;
2. selection of the interface towards the sample substance in the form of an ellipsoid of revolution;
3. selection of the two interfaces (exterior towards the sample container and sample container towards the sample substance) in such a fashion that the magnetic disturbances inside the sample substance largely cancel.

1. Adjustment of the Magnetic Susceptibility

When the susceptibility across the interface between the sample substance and the sample container remains constant, the magnetic field does not become inhomogeneous at that location. This configuration is described in [5], [6]. A sufficiently large amount of a paramagnetic substance is added to the material of the sample container, e.g. glass, in [6] such that the magnetic susceptibility of the container exactly corresponds to that of the sample substance to be examined. The outer interfaces are disposed remote from the sample volume for minimizing the magnetic disturbance in the sample volume due to the susceptibility change between the sample container and the exterior.

2. Interface in the Form of an Ellipsoid of revolution

One knows from [7] that the magnetic field inside a body, which has the interface of an ellipsoid and consists of magnetically homogeneous material, is homogeneous in the inside of the body when an external homogeneous magnetic field is applied. The magnetic susceptibility of the body (in the present case the sample substance container) may differ in this case from the magnetic susceptibility of the sample substance. Like in case of adjustment of the magnetic susceptibility, the end of the sample substance container remote from the sample substance must be sufficiently removed from the sample substance to ensure that the field inhomogeneity generated at this end does not have any influence on the sample volume.

3. Selection of the Two Interfaces in Order to Minimize the Field Inhomogeneity

In [8], the interface between the environment and the sample container and that between the sample container and the sample substance are selected in such a fashion that the magnetic field inside the sample volume remains largely homogeneous when a homogeneous magnetic field $B_0$ is applied. The field disturbance inside the sample volume is therefore minimized through selection of the interfaces. No information is given about the type of disturbance that remains after selection of the interface prior to shimming with the exception that the field disturbances in the entire sample volume should be minimum.

The conventional devices, however, have considerable disadvantages.

In methods 1 and 2, the ends of the sample containers must be disposed remote from the central area in order to obtain the desired effect.

The technology for producing the glasses with susceptibility correction in accordance with method 2 is complex and expensive.

The sample bottoms generated according to method 3 are very thick. This is disadvantageous in that the sample is greatly extended and also becomes considerably heavier than a standard sample with a bottom having the same thickness as the sidewalls. Furthermore, in method 3, a residual field remains after shimming in all practical cases, i.e. in case of sample bottoms having a non-infinite thickness.

It is the object of the inventive device to obtain an NMR measuring configuration and a method for calculating the design of a sample container, thereby minimizing disturbances in an NMR measurement due to field inhomogeneities caused by susceptibility jumps at the interface between the sample container and the sample substance, and also minimizing the required volume of sample substance.

SUMMARY OF THE INVENTION

This object is achieved by a measuring configuration and methods according to the independent claims.

In accordance with the invention, the geometry of the sample container is selected in such a fashion that, when a homogeneous magnetic field $B_0$ has been applied, there is a location-dependent relative field change in the volume prior to shimming due to the susceptibility jumps at the interfaces, that field change being larger than 20 ppb at at least one point in the center partial volume, the residual field in the center partial volume after shimming is smaller than 1.6 ppb and the residual field in the partial volume R2a is smaller than 30 ppb.

In accordance with the invention, the structure of the residual field is influenced in such a fashion that the shimming process is thereby taken into consideration. Towards this end, relatively large field changes that can be expanded in rotationally symmetrical spherical functions of low order (N<5, preferably N<11) are accepted in the inventive measuring configuration (in contrast to prior art [8] which minimizes the field change). These relative field changes are permitted, since they can be compensated for by means of conventional shim coil systems with rotationally symmetrical coils. This results in a larger degree of freedom with respect to the design of the shape of the sample container. The expansion of the field disturbance in rotationally symmetrical spherical coordinates simulates a shimming process. The selection of the order of expansion in rotationally symmetrical spherical coordinates depends on the shim coil system that is to be used in connection with the inventive measuring configuration.

The inventive measuring configuration is advantageously provided as part of an NMR system with a magnet coil for generating the homogeneous magnetic field $B_0$, a shim coil system, and an RF coil. The shim coil system and the RF coil are arranged around the sample tube in such a fashion that the coil center of the RF coil (center of gravity of the RF coil profile on the z axis) and the center of the shim coil system (FIG. 6 in [10]) are positioned at the origin of the spherical coordinate system which represents the center (geometrical center of gravity) of the first partial volume. The strongest RF field of the RF coil then prevails in the center partial volume. The symmetry axes of the magnet coil, of the RF coil and of the shim coil system are oriented parallel to the z-axis. A shim coil system is used to compensate for the relative field change, which can generate a field that can generate a number N of mutually independent shim magnetic fields, which are rotationally symmetrical with respect to the z-axis of the spherical coordinate system. Moreover, conventional shim coil systems also use coils that generate non-rotationally symmetrical fields. N is thereby equal to the order of expansion of the relative field change F around the center SZ in rotationally symmetrical spherical functions. These rotationally symmetrical spherical functions can be generated through suitable combination of the rotationally symmetrical magnetic fields. Shim coil systems of this type are known in the art [10]. The shim functions of zero, first . . . to N-th order are explicitly taken into consideration in the selection of the geometry of the sample container. The field inhomogeneities generated by the interfaces can then be compensated for in such a fashion that the remaining field inhomogeneities in the center partial volume are minimized.

The inventive measuring configuration therefore enables minimizing field inhomogeneities caused by the interfaces by means of conventional shim coil systems, wherein the sample container shape can be selected with greater freedom than has previously been possible.

The inventive measuring configuration may comprise both a sample container that is open at the top and therefore has a further interface G3 between the sample substance and the environment, and also a sample container that is closed with respect to the environment and correspondingly has no further interface G3 between the sample substance and the environment.

The sample container of the inventive measuring configuration is not adjusted to the susceptibility, i.e. the susceptibility of the sample container differs from that of the sample substance.

The center partial volume is the volume in which the highly sensitive area of the RF coil should be located when a measuring configuration with an RF coil is used, i.e. that region from which the signals are obtained during an MR measurement. It is therefore also called "active volume". The center partial volume is therefore, in practice, predetermined by the geometry of the RF coil to be used. The lower partial volume adjoins the center partial volume in the direction of the bottom of the sample container. The center of the center partial volume is defined by the geometrical center of gravity of the center partial volume, which is located on the z-axis (axis of rotation in rotationally symmetrical sample containers). In prior art devices, the sum of the upper and lower partial volumes is approximately as large as the center partial volume when no measures for reducing the magnetic disturbances at the ends of the sample container are taken (cf. method 1-3 above). In the inventive measuring configuration, the lower and upper partial volumes and therefore also the overall volume (V=V1+V2a+V2b) of the sample substance may be selected to be smaller compared to prior art. The interfaces between the sample container and the environment are then closer to the center volume than in prior art (separation of the interfaces sample substance/sample container with respect to interface V2a/V1 or V2b/V1 are smaller than in prior art) such that only a small amount of sample substance is required for the measurement.

The susceptibility jumps at the interfaces cause field inhomogeneities. The sample container advantageously has a constant susceptibility. However, it is, in principle, also feasible for the susceptibility of the sample container to locally vary.

The sample substance is advantageously in liquid form. Liquid samples place the highest demands on the spectral line width, and for this reason, the inventive configuration offers maximum benefit for liquids. However, gaseous and powdery substances are also feasible.

A location-dependent magnetic field that is composed of the homogeneous magnetic field $B_0$ and the disturbance fields $B_j$ prevails in the volume V.

During shimming, the expansion $F^N$ of the relative field change F in rotationally symmetrical spherical functions up to an order N is subtracted from the relative field change F. This changes the field both in the lower partial volume and in the upper partial volume. Depending on the dependence of the relative field change F and the size of the partial volumes, it may happen that an initially large inhomogeneity in the lower partial volume can be reduced by shimming, thereby, however, indirectly increasing the inhomogeneity in the upper partial volume. In order to avoid this case, an additional criterion is advantageously taken into consideration in selecting the geometry of the sample container, i.e. that, when a homogeneous magnetic field $B_0$ is applied, the following applies to a third residual field in the upper partial volume: $R_{2b} \leq 30$ ppb, wherein $$R_{2b} := \left( \frac{1}{V_{2b}} \int_{V_{2b}} (F - F^N)^2 \, dV \right)^{1/2}$$

is the third residual field (in the upper partial volume (V2b))

In this embodiment, the residual field in the lower partial volume (second residual field) and the residual field in the upper partial volume (third residual field) are simultaneously limited. The residual field in the upper partial volume could be easily reduced by filling the sample container to a sufficient level with sample liquid. This, however, increases the upper partial volume and correspondingly impairs the ratio between the active and the passive sample volume. For this reason, it is desirable to minimize the residual field in the upper partial volume and, in accordance with the invention, to do so via the geometry of the sample container.

The sample container advantageously has a multiple symmetry with respect to rotation about the z-axis, advantageously a cylindrical shape with e.g. elliptical or rectangular cross-section. The sample container is preferentially rotationally symmetrical, in particular circularly cylindrical.

The extension of the upper partial volume and/or the lower partial volume in the z direction is smaller than the shortest secant, intersecting the z-axis, of the cross-section of the sample container. The shortest secant, intersecting the z axis, of the cross-section is e.g. the diameter of a circle in case of a circular cross-section, the small semi-axis of the ellipse in case of an elliptical cross-section, and a parallel of the short side of the rectangle in case of a rectangular cross-section.

In order to obtain a compensation effect on the disturbance fields generated by the interfaces, the sample container is advantageously made from a material, the magnetic susceptibility of which has a larger magnitude than the magnetic susceptibility of the sample substance and has the same sign as the latter. Sample containers made from glass meet this requirement for practically all relevant solvents and moreover also meet the requirement of being electrically insulating and chemically inert.

The sample container is preferentially produced from glass, in particular, from borosilicate glass or quartz glass. Borosilicate glass is a type of glass that is easy to process, can be subjected to large temperature fluctuations and has a magnetic susceptibility of −11 ppm. Water, being one of the solvents that are used in connection with NMR, has one of the highest susceptibilities with −9.05 ppm. Acetone is at the other end of the scale with −5.78 ppm. The rather small susceptibility difference between borosilicate glass and water produces sample bottoms of particular great thickness using the method according to [8]. The combination of sample containers of borosilicate glass with sample substances dissolved in water, which is important in practice, therefore benefits to a great extent from the geometrical shape of the sample container in accordance with the present invention.

Since the susceptibility of the sample substance does not or only minimally differ from that of the solvent, the sample container is generally exclusively optimized for one special solvent. In one particularly preferred embodiment, the magnetic susceptibility of the sample substance is within the susceptibility interval of water and acetone.

The environment advantageously consists of air or nitrogen.

In one particularly preferred measuring configuration, the sample container is a thin-walled, circular cylindrical tube with a bottom and a cylinder lateral surface, wherein the bottom and the cylinder lateral surface each have an inner surface and an outer surface. The lateral surface of the tube extends parallel to the axis of rotation (z axis). The inner surface of the bottom and the inner surface of the lateral surface form the inner surface of the sample tube. It is covered by the sample substance when the tube is completely filled. The lateral outer surface and the outer bottom surface form an outer surface of the sample tube.

The maximum thickness of the bottom of the tube is advantageously 0.4 to 0.6 times that of the outer tube diameter. The ratio d/D (bottom thickness with respect to the outer diameter of the sample container) influences the residual field in the lower partial volume. Values of d/D between 0.4 and 0.6 yield small values for the residual field in the lower partial volume. In this case, one is relatively independent of the exact shape of the second interface (interface between sample container and sample substance). The thickness of the bottom is the separation between the inner surface of the bottom and the outer surface of the bottom. This separation may vary within the bottom. If there is e.g. a central curvature of the inner bottom surface, whereas the outer bottom surface is flat, the thickness of the bottom in the center (intersection with the z axis) is maximum (in case of an elevation) or minimum (in case of a depression).

In one particular embodiment, both the inner surface and the outer surface of the bottom of the tube are formed by a flat end, perpendicular to the axis of rotation. The lower end of the sample container is thereby given a compact design. This is enabled in accordance with the invention in that the geometry of the sample container is determined by taking into consideration the available shim functions (rotationally symmetrical spherical functions of low order). The contours of the inventive sample container may extend with small radii of curvature at the transition to the tube wall. In accordance with the invention, only gradients of high order must be avoided. Gradients of low order can be eliminated during the shimming process. The most compact end for a circular cylindrical sample tube can be achieved when both the inner surface and the outer surface are described by a plane perpendicular to the cylinder axis. The optimum bottom thickness may be adjusted in dependence on the susceptibility of the sample container material and the sample substance to be used. A flat outer end surface moreover facilitates exact adjustment of the bottom thickness through grinding of the outer surface.

The contour of the inner surface of the tube bottom may alternatively be described by a curve having a central curvature. By melting a cylindrical tube, one obtains inner contours that enable smooth transition from the cylindrical wall to the end on the cylinder axis. Such an inner contour is defined by a curve, which extends in a horizontal direction at the axis of rotation of the tube, and extends in a perpendicular direction at the wall of the tube. As degree of freedom, the possibility remains to shape this curve in such a fashion that a slight curvature in the form of an elevation or a depression is formed in the center of the tube. The height of the curvature and the thickness of the bottom may be matched such that the residual fields are minimized after shimming. A mathematical description is given in a simple way through a spline function, the direction of which is predetermined on the axis of rotation and on the sample container wall. The height of the curvature may be controlled by a parameter of the spline function.

In many NMR experiments, it is important for the sample substance to have an exactly defined temperature. Towards this end, a temperature-control gas flows around the sample container. Although the above-described cylindrical end yields the most compact end, the perfect cylinder shape of the outer contour is disadvantageous in that, due to the sharp edge, the gas flow could be impaired. For this reason, it may be advantageous to form the outer contour of the tube with a flat bottom in the central area close to the axis of rotation and a rounding radius at the transition to the cylindrical lateral surface. "Flat" in this case means perpendicular to the axis of rotation and not curved.

Another possibility of preventing impairment of the gas flow around the sample container consists in forming the outer contour of the tube at the lower end by one half of an ellipsoid of revolution, the shortest semi axis of which lies in the direction of the tube axis. The described orientation of the semi axis keeps the end as compact as possible.

In order to specifically influence the residual field in the upper partial volume, it may be advantageous for the sample container to comprise a sealing element which is formed in such a fashion that it can be inserted from the open end after filling in the sample substance and be brought into direct contact with the sample substance. The sealing element may be provided in the form of a plug and advantageously have the same susceptibility as the sample tube.

The invention also concerns a method for calculating the shape of a rotationally symmetrical sample container that is closed on one side for a measuring configuration as described above.

A first variant of the inventive method comprises:

a) Defining the susceptibilities of the ambient medium, of the material of the sample container and of the sample substance; defining the maximum order N for expansion of the relative field change in rotationally symmetrical spherical functions; defining an admissible upper limit for the residual fields in the central and lower partial volumes and, if necessary, in the upper partial volume;

b) Determining a parametrized starting contour in a spherical coordinate system by defining part of the shape of the sample container that shall remain unchanged during the proceedings; defining the dimensions and the position of the center partial volume of the sample substance within the constant part of the sample container; defining one or more geometrical shapes and/or functions that continue the defined constant part of the shape to form a complete sample container;

c) Determining the parameters that describe the dimensions of these geometrical shapes and/or functions;

d) Establishing a contour of the sample container through selection of a value for each parameter;

e) Defining a grid of points in the spherical coordinate system and allocating grid points to the partial volumes;

f) Calculation of the relative field change caused through application of an external homogeneous magnetic field that extends parallel to the z-axis at the grid points;

g) Expanding the relative field change in rotationally symmetrical spherical functions up to an order N about the origin of the spherical coordinate system, wherein N=4 to 10;

h) Calculation of the residual fields in the center and lower partial volume and, if necessary, in the upper partial volume;

i) If at least one of the defined upper limits for the calculated residual fields is exceeded: repeating steps d)-i), wherein at least one parameter value is changed until a combination of parameter values has been found that does not exceed any of the defined upper limits for the residual fields.

Definition of the center partial volume depends on which RF coil shall be used in connection with the sample container. The center partial volume is selected in such a fashion that it covers the highly sensitive area of a predetermined RF coil. The other two partial volumes are variable, since the inner contour may change which changes the upper and lower partial volumes.

Parts of the sample container that are invariant in the z direction are advantageously defined as constant parts of the shape of the sample container: e.g. a circular cylindrical lateral surface having a specific diameter and a defined wall thickness. The center volume is advantageously defined within that range.

The approximate shape of the variable parts of the sample glass (e.g. whether the bottom of the glass shall be curved or flat) is defined, i.e. geometrical shapes are selected, which provide the contour of the variable parts of the sample glass. The inventive method merely varies the values of the parameters that were allocated to this defined geometrical shape. The variable parts of the sample container may also include contours that are composed of several geometrical shapes. The parts of the sample container determined by the parameters advantageously comprise those parts of the container that are not invariant when shifted in the z-direction, i.e. primarily the bottom and possibly the sealing element of the sample container. Feasible geometrical shapes of the variable parts are e.g. (but not exclusively) a flat disc (with disc thickness, rounding radius towards the lateral surface, ratio between thickness and diameter of the disc as parameters), a spherical segment as curvature or indentation (with radius of the sphere, height of the segment, radius of the intersecting plane of sphere and end surface as parameters), an ellipsoid of revolution segment (with large and small semi axes, height of the segment as parameters).

A parametrized contour of the sample container is defined by determining the invariable parts of the shape of the sample container, the geometrical shapes that continue the defined, invariable part of the shape to form a complete sample container, and the parameters. The contour, in particular, the shape of the three interfaces, the shape of the sample container and the size of the upper and lower partial volumes (and therefore also of the overall volume of the sample substance) result from the selected parameter values. The upper and lower partial volumes result from the selected geometrical shapes and the parameter values. The grid points disposed in the three partial volumes are associated with these partial volumes. The respective field change and the expansion of the field change are calculated in spherical coordinates at the associated grid points. The residual fields generated by a sample glass with this starting contour in a homogeneous magnetic field $B_0$ are calculated and compared with the admissible upper limits. During calculation of the residual fields, the sum of the grid points associated with the corresponding volume replaces the integral due to discretization on a grid. When one of the upper limits is exceeded, the contour is changed by changing at least one parameter. The method can be performed by means of conventional optimization algorithms, e.g. by means of a Newton method.

In a second variant of the inventive method, the following steps are carried out:

a) Defining the susceptibilities of the ambient medium, of the material of the sample container and of the sample substance, defining the maximum order for an expansion of the relative field change in rotationally symmetrical spherical functions;

b) determining a parametrized starting contour in a spherical coordinate system through defining part of the shape of the sample container, which should remain unchanged during the method; defining the position and dimension of the center partial volume of the sample substance within the constant part of the sample container; defining one or more geometrical shapes and/or functions which continue the determined constant part of the shape to form a complete sample container;

c) determining the parameters that describe the dimensions of these geometrical shapes and/or functions;

d) establishing a contour for the sample container through selecting a value for each parameter;

e) defining a grid of points in the spherical coordinate system and allocating grid points to the partial volumes;

f) calculating the relative field change caused through application of an external homogenous magnetic field, which extends parallel to the z axis, at the grid points;

g) expanding the relative field changes in rotationally symmetrical spherical functions up to an order N about the origin of the spherical coordinate system, wherein N=4 to 10;

h) calculation of the residual fields in the center and lower partial volumes and, if necessary, in the upper partial volume;

i) defining a cost function $f=-w_1*R_1-w_{2a}*R_{2a}-w_{2b}*R_{2b}$, wherein $0 \leq w_1 \leq 1$, $0 \leq w_{2a} \leq 1$ and $0 \leq w_{2b} 1$;

j) application of a numerical optimization algorithm for determining a set of parameter values which define a minimum of the cost function f, wherein the parameter values determined in this fashion are used for steps d) to j) until an optimum of the cost function f is obtained.

In this method variant, the result of a cost function is used as criterion according to which one decides whether the established contour of the sample container meets the desired specifications, whereas compliance with limit values for the residual fields in different partial volumes is used as criterion in the first variant. The optimum of the cost function is obtained for a local or global extreme value of the cost function. The method can be performed by means of conventional optimization algorithms.

Both methods are based on the principle that inhomogeneities up to N-th order in the center partial volume, which are caused by the susceptibility jump at the border of the sample volume, are deliberately not compensated for, since they can be easily eliminated by means of a conventional shim coil system. In consequence thereof, both the residual field in the center partial volume and also the residual field in the lower partial volume can be reduced in size in a much more effective fashion.

This increases the freedom with respect to designing the shape of the sample container. In particular, the upper and the lower partial volume can be reduced in size such that only a small amount of sample substance is required for the measurement. For this reason, the quality of the NMR signals can be optimized, i.e. the NMR lines are as narrow as possible, there are hardly any artefacts or undesired disturbance lines, wherein the latter can occur, in particular, in experiments for suppressing solvent signals.

The inventive NMR measuring configuration is advantageously used in NMR spectroscopy or magnet resonance imaging applications.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

(b) is closed by a sealing element.

Figure 5:
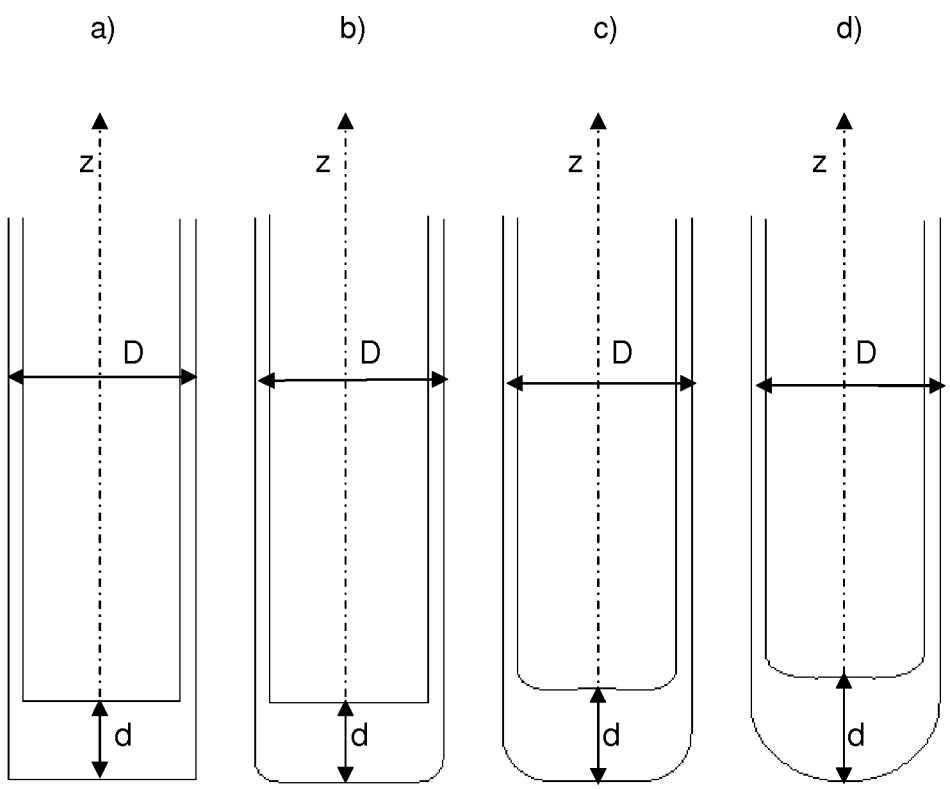
Figure 6:
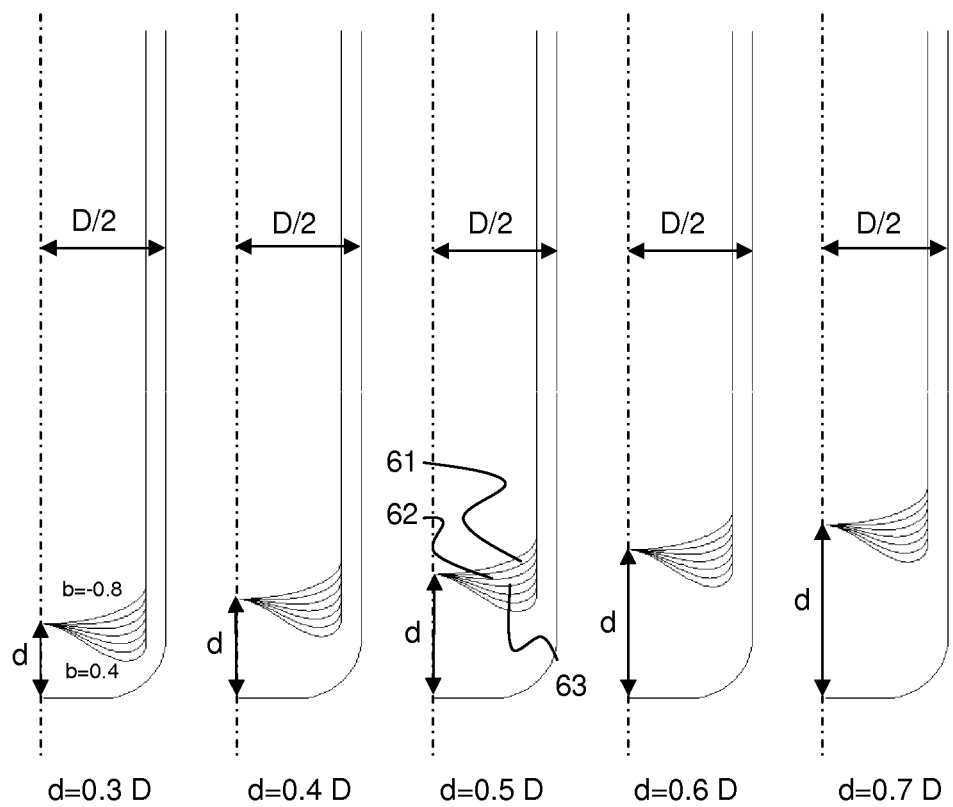
Figure 7:
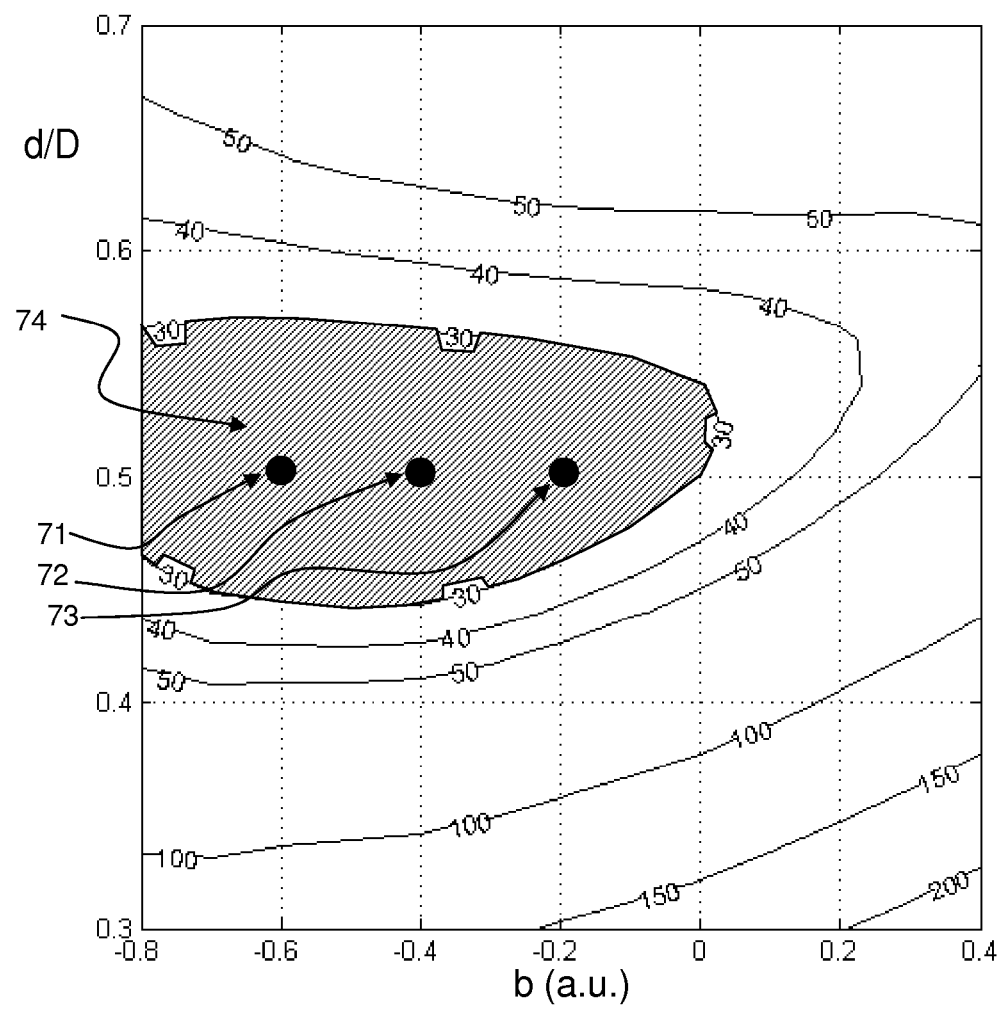
Figure 8:
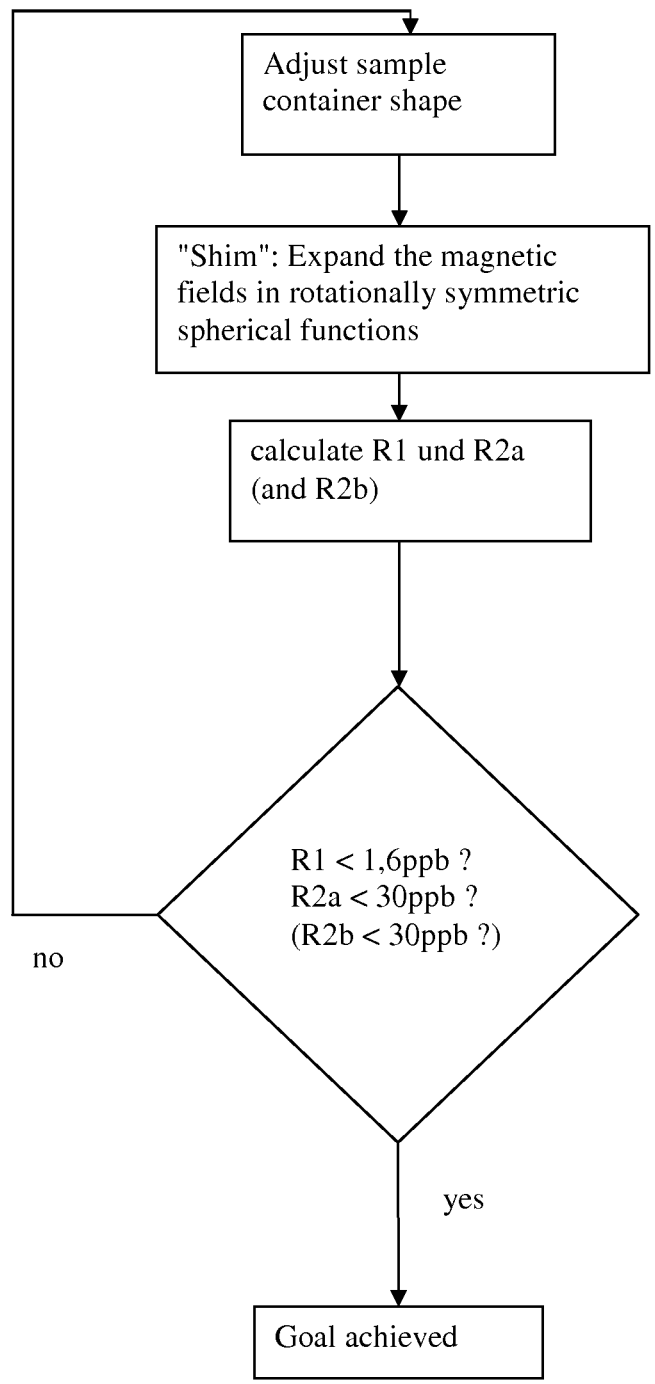
Figure 9:
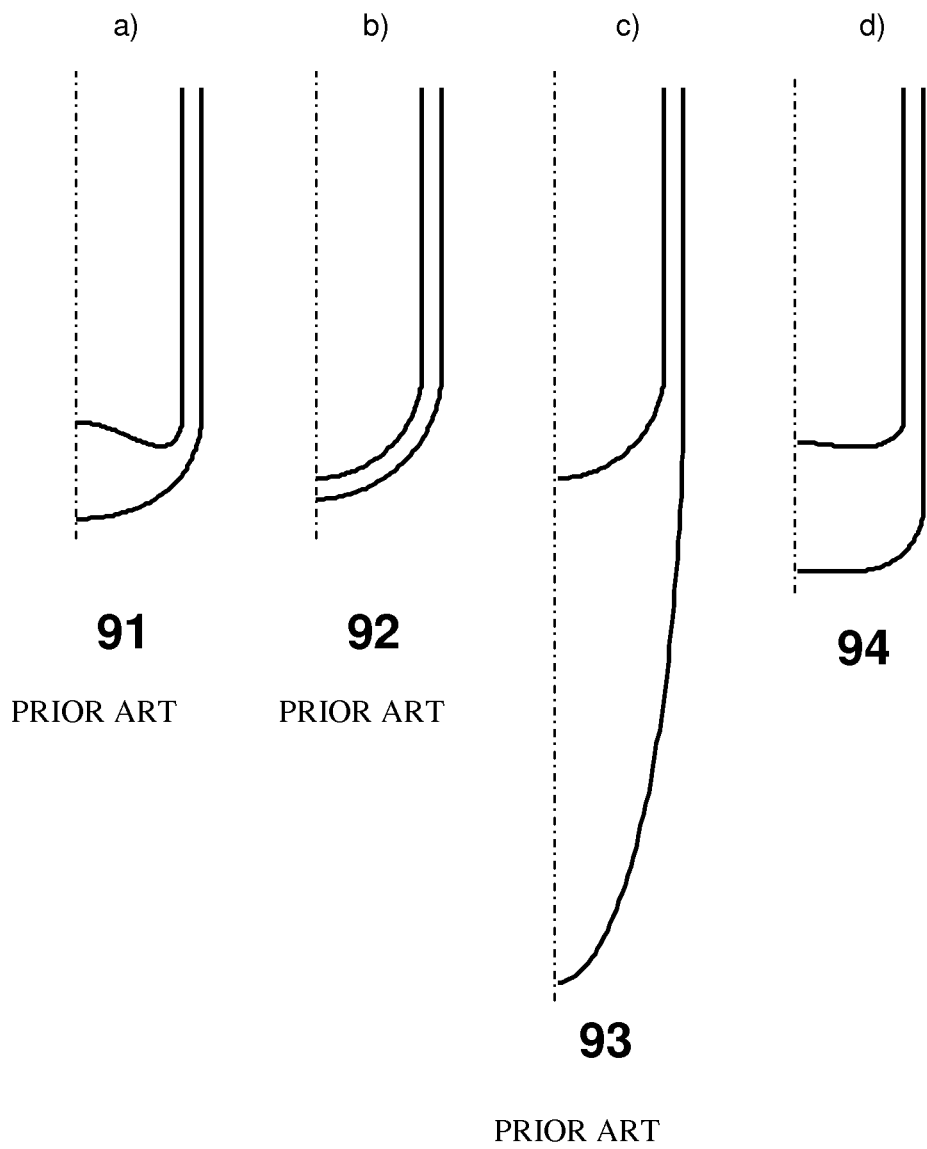
Figure 10:
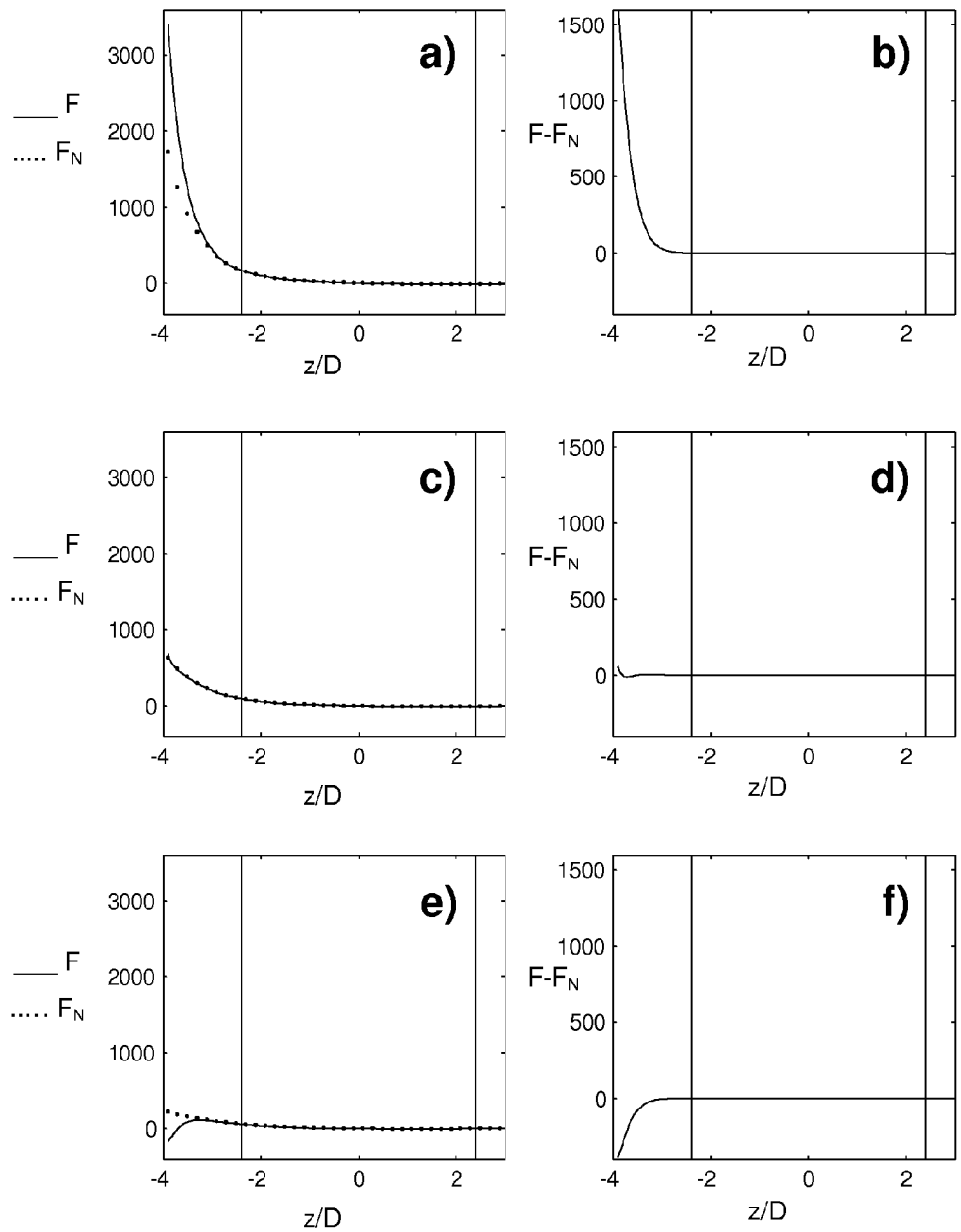
Figure 11A:
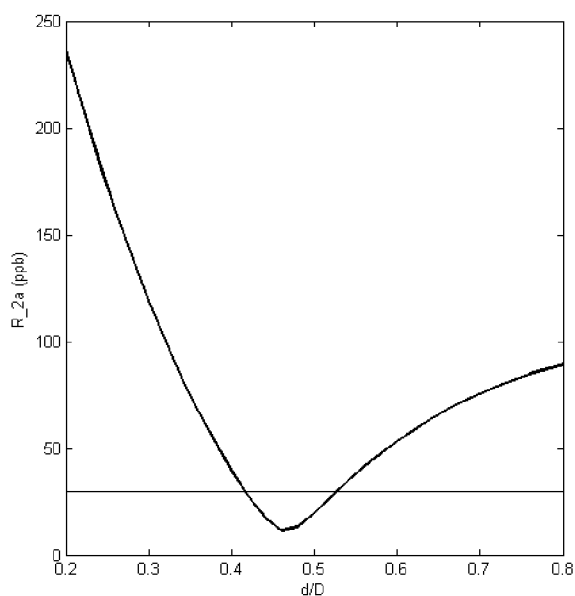
Figure 11B:
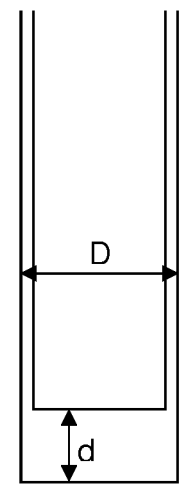
Figure 13A:
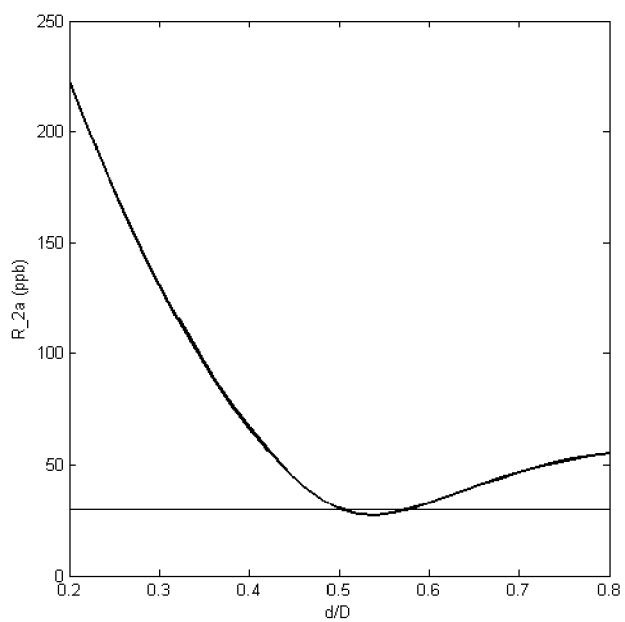
Figure 13B:
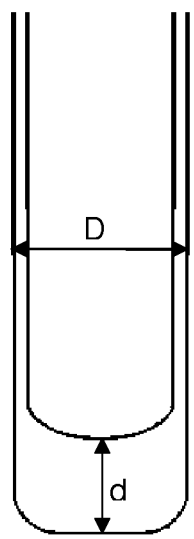

FIG. 5 shows a sectional view of different ends of rotationally symmetrical sample containers in the form of a thin-walled circular cylindrical tube, (a) wherein the bottom of the inner surface and also of the outer surface is formed by a flat end perpendicular to the cylinder axis;

(b) wherein the outer contour of the tube is formed by a flat bottom in the central area close to the axis of rotation and a rounding radius at the transition to the cylindrical lateral surface;

(c) wherein the inner contour of the tube is defined by a curve, which extends in a horizontal direction at the axis of rotation of the tube and in a perpendicular direction at the wall of the tube, and also describes a curvature in the center of the tube;

(d) wherein the outer contour of the tube is formed at the lower end by one half of an ellipsoid of revolution, the shortest semi axis of which lies in the direction of the tube axis;

FIG. 6 shows a view of a group of curves for describing feasible inner interfaces described by the parameters d (maximum bottom thickness) and b (curvature dimensions). Each partial image shows a section through the inner and outer interfaces of a rotationally symmetrical sample container at its sealed lower end;

FIG. 7 shows a view of the dependence of the residual field $R_{2a}$ in the lower partial volume on the parameters d and b for the shapes of the sample containers shown in FIG. 6, contour lines of the residual field $R_{2a}$ in the lower partial volume are stated in ppb;

FIG. 8 shows a view of the inventive iterative method for optimizing the sample container;

FIG. 9 shows sectional views through four different rotationally symmetrical sample containers in the area of the lower end (a) with a lens-shaped bottom in accordance with prior art;

(b) with a constant wall thickness in accordance with prior art;

(c) with minimized field change in accordance with [8];

(d) with minimized residual fields in accordance with the invention;

FIG. 10 shows an illustration of the generation of residual fields after shimming for sample container geometries in accordance with FIG. 9(d), with (a)+(b) bottom thickness d=0.1 D (c)+(d) bottom thickness d=0.48 D (e)+(f) bottom thickness d=0.8 D FIG. 11a shows a graph of the dependence of the residual field R2a in the lower partial volume on the ratio d/D for a sample container geometry with a lower end with flat inner and outer contours in accordance with FIG. 11b;

FIG. 11b shows a sample container geometry with a lower end with flat inner and outer contour having a residual field R2a in accordance with FIG. 11a;

FIG. 12a shows a graph of the dependence of the residual field R2a in the lower partial volume on the ratio d/D for a sample container geometry with a lower end with flat inner contour and with an outer contour having a rounding radius in accordance with FIG. 12b;

FIG. 12b shows a sample container geometry with a lower end with flat inner contour and an outer contour having a rounding radius and comprising a residual field R2a in accordance with FIG. 12a;

FIG. 13a shows a graph of the dependence of the residual field R2a in the lower partial volume on the ratio d/D for a sample container geometry with a lower end with ellipsoid inner contour and outer contour having a rounding radius in accordance with FIG. 13b;

FIG. 13b shows a sample container geometry with a lower end with ellipsoid inner contour and an outer contour having a rounding radius and comprising a residual field R2a in accordance with FIG. 13a.

DESCRIPTION OF THE PREFERRED EMBODIMENT

Figure 1:
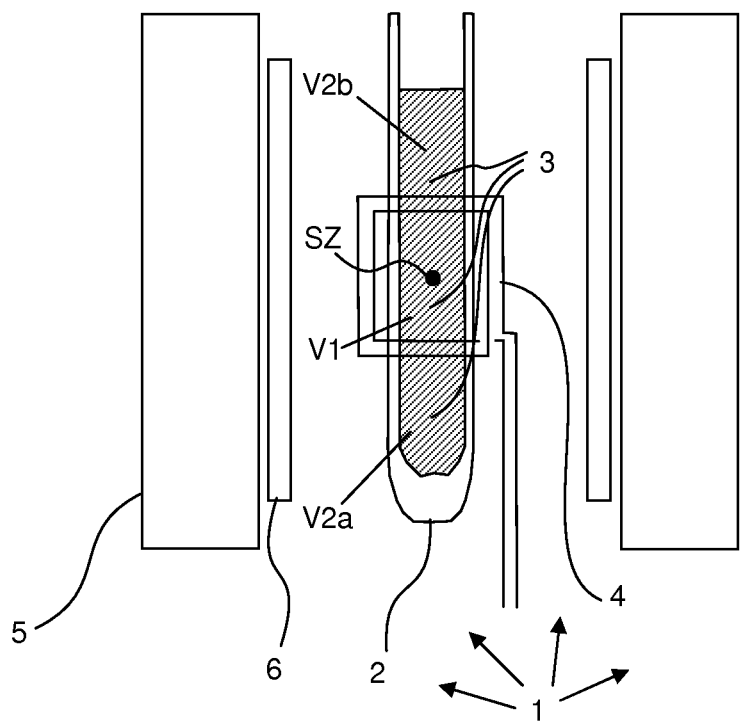
FIG. 1 shows a schematic view of an MR system with an inventive measuring configuration.

FIG. 1 schematically shows an MR system with a magnet 5 for generating a static magnetic field $B_0$ of an RF coil 4, a shim coil system 6, and an inventive NMR measuring configuration.

Figure 2:
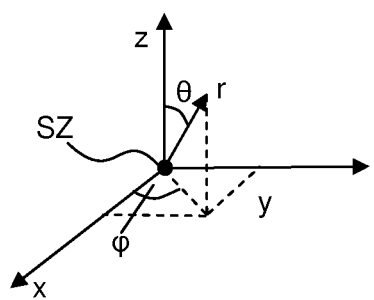
FIG. 2 shows a coordinate system with origin SZ in which the spherical functions are defined.
Figure 3:
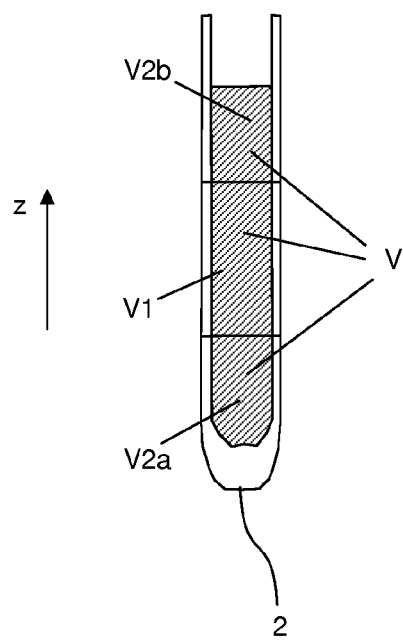
FIG. 3 shows a sample container filled with sample substance and division of the overall sample substance volume V into partial volumes $V_1$, $V_{2a}$, $V_{2b}$.

A sample container 2, which is filled with a sample substance, is located in an environment 1. The sample substance 3 occupies a sample volume V in the sample container 2, which is divided into a center partial volume V1, a lower sample volume V2a and an upper partial volume V2b, as is illustrated in FIG. 3. The center partial volume V1 represents the active sample volume in the NMR system, i.e. the sample container 2 is positioned in the NMR system in such a fashion that the center of the center partial volume V1 coincides with the center of the RF coil that is provided by the center of gravity of the RF profile. This center is the origin SZ of a spherical coordinate system (FIG. 2).

The shape of the sample container illustrated in FIGS. 1 to 4 is only given by way of example.

Figure 4A:
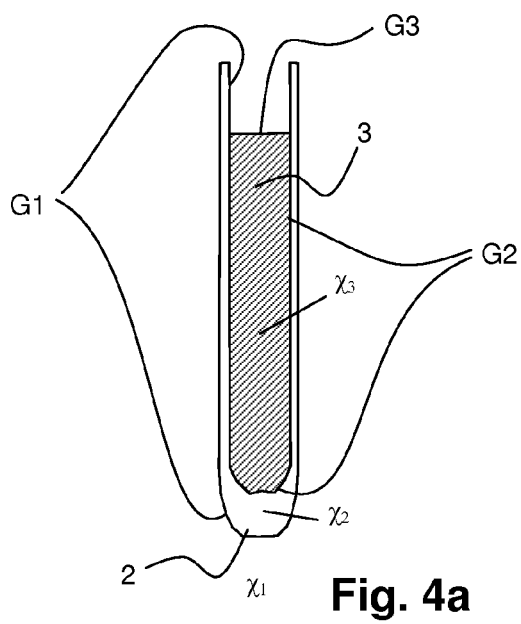
FIG. 4 shows a sample container filled with a sample substance with the magnetic susceptibilities of the used materials, and interfaces where susceptibility jumps occur, wherein the sample container (a) is open at the top such that the sample substance is in direct contact with the environment.
Figure 4B:
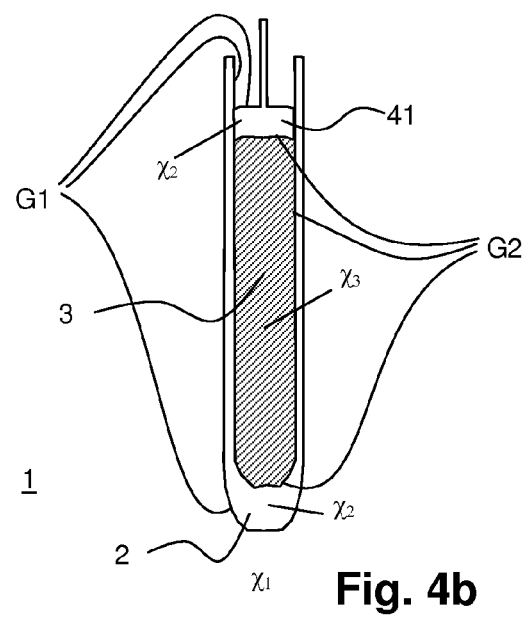

In FIG. 4a, a first interface G1 is marked between the sample container 2 and the environment 1, a second interface G2 is marked between the sample substance 3 and the sample container 2, and a third interface G3 is marked between the sample substance 3 and the environment. The sample container is open towards the top. In order to avoid a third interface G3, a sealing element 41, e.g. in the form of a plug, preferably having the same susceptibility as the sample container 2, can be inserted into the sample container 2 as illustrated in FIG. 4b.

Field inhomogeneities are generated in the sample volume V, which are caused by susceptibility jumps at the interfaces G1, G2, G3. The influence of these field inhomogeneities on the NMR signal quality depends on the separation between the borders of the sample volume V and the active sample volume V1, in particular, on the separation of the bottom and the interface G3 or the sealing element from the active volume V1. In accordance with the invention, this separation is correspondingly reduced by minimizing the sample volume V, i.e. the extension of the lower and/or upper partial volume in the direction of the z axis can then be selected to be smaller.

While the field homogeneity in the active sample volume V1 is decisive for the line width, field inhomogeneities in the border region (i.e. in the upper partial volume V2a and in the lower partial volume V2b) can generate artefacts or undesired disturbance lines. The field inhomogeneity in the active sample volume V1 can be largely compensated for by means of the shim coil system 6. However, control of the field inhomogeneities in the upper and lower partial volumes V2a, V2b for samples according to prior art is difficult by means of a shim coil system 6, since these insensitive areas of the RF coil 4 contain little information for the shimming process. During shimming, the field inhomogeneities in the inner partial volume V1 are generally optimally corrected and the field inhomogeneities in the outer volumes V2a and V2b are thereby automatically obtained due to the global effect of the shim coil fields.

In the inventive measuring configuration, the shape of the sample container 2 (in particular, the wall thickness of the bottom) is selected in such a fashion that the parts of the relative field change F, which cannot be expanded in rotationally symmetrical spherical functions of low order (N<11, in particular N<5), become as small as possible. During shimming of the active sample volume V1, the field inhomogeneities in the lower partial volume V2a are therefore minimized at the same time.

The shape of the sample container 2 is optimized by means of an iterative method as illustrated in FIG. 8. It starts with a parametrized starting contour of the sample container 2, which is discretized on a suitable grid. The fields resulting from this contour are subsequently expanded in rotationally symmetrical spherical functions up to an order N (simulating the shimming process). The residual field R1 in the center partial volume V1, which substantially is a measure for the width of the NMR lines, is subsequently determined. In the present inventive method, the residual field R2a in the lower partial volume V2a is moreover calculated. When neither of the two conditions R2a<30 ppb and R1<1.6 ppb is met, the repetitive optimization process is continued with renewed change of the sample container contour. For changing the parametrized contour, conventional optimization algorithms (e.g. Newton methods) are used. Optimization is terminated when the two above-mentioned conditions are met.

The parametrized contour comprises part of the shape of the sample container 2 that is to remain unchanged, and one or more parts that can be changed by changing parameters. The variable part of the contour is, in general, the bottom of the sample container 2 and the transition from the bottom to the constant part of the sample container 2. The shape of the bottom of the sample container is therefore substantially optimized. This optimization process may alternatively or additionally also be used for the sealing element 41 like for the sample container bottom. In particular, the residual field R2b in the upper partial volume can be minimized through parametrization and optimization of the contour of the sealing element 42. Towards this end, the residual fields R2b and R1 in the upper and center partial volumes V2b, V1 are optimized and the termination criteria R2b<30 ppb and R1<1.6 ppb are used. The method can therefore be similarly used for optimizing the container bottom and the sealing element 41. The residual field R2a in the lower partial volume V2a (for optimizing the container bottom) or the residual field R2b in the upper partial volume V2b (for optimizing the sealing element 41) are thereby minimized together with the residual field R1 in the center partial volume V1.

Geometrical shapes are defined for the variable part of the contour, which describe the approximate shape of the variable parts. FIG. 5 shows ends of rotationally symmetrical sample containers (in the present case not filled), the contours of which contain different geometrical shapes. What the sample containers shown in FIG. 5 all have in common is a cylindrical basic shape with an outer diameter D.

In the sample container 51 illustrated in FIG. 5a, the bottom of both the inner surface and the outer surface is formed by a flat end perpendicular to the cylinder axis, i.e. both the outer contour and the inner contour of the sample container are described by a circular cylinder differing in diameter and height. The difference in height corresponds to the thickness d of the bottom. The thickness d of the bottom can e.g. be used as a parameter for the inventive optimization method.

In FIG. 5b, the outer contour of the tube is formed by a flat bottom in the center area close to the axis of rotation and a rounding radius at the transition to the cylindrical lateral surface. For this reason, the rounding radius is required for describing the outer contour. The thickness d of the bottom and also the rounding radius may be used as parameters for the inventive optimization method.

FIG. 5c shows an embodiment, in which the inner contour of the sample container is defined by a curve, which extends in a horizontal direction at the axis of rotation of the tube, and in a perpendicular direction at the wall of the tube, and moreover describes a small curvature in the center of the bottom of the sample container. The outer contour moreover has a rounding radius analogous to FIG. 5b, in the present case, however, with a larger rounding radius. The thickness d of the bottom, the rounding radii of the inner and outer contour and the radius of the curvature (in case of a spherical curvature) and the height of the spherical segment may be used as parameters for the inventive optimization method. In this case, the contour is composed of many geometrical shapes and can be described by a spline function.

FIG. 5d shows an embodiment, in which the lower end of the outer contour of the tube is formed by one half of an ellipsoid of revolution, the shortest semi axis of which lies in the direction of the tube axis (z direction). The thickness d of the bottom, the rounding radius of the inner contour and the semi axes of the ellipsoid of revolution may be used as parameters for the inventive optimization method.

FIG. 6 shows a group of curves for the contour of a sample container, wherein the inner contour has a central curvature and a rounding radius at the transition to the wall of the sample container. The parameters d (maximum thickness of the bottom) and b (dimension for the height of the curvature) were varied. Each partial view shows a section through the inner and outer interface of a rotationally symmetrical sample container at its sealed lower end. In each partial view, the maximum thickness d of the bottom has a fixed ratio with respect to the diameter D of the sample container 2. The parameter b is varied for generating different curve shapes (from the top to the bottom: b=−0.8, −0.6, −0.4, −0.2, 0.0, 0.2, 0.4). The partial views differ with respect to the maximum thicknesses d of the bottom. The range of values for d and b for the illustrated curves corresponds to the range of values illustrated in FIG. 7. The curve shapes designated by 61, 62, 63, correspond to the pairs (b, d), which are marked in FIG. 7 by points 71, 72, 73.

The height of the curvature and the thickness of the bottom may be matched in such a fashion that the residual fields R1 and R2a are minimized after shimming. The group of curves illustrated in FIG. 6 was calculated in a simple fashion through a spline function, the direction of which on the axis of rotation and on the sample container wall is predetermined. The height of the curvature can be regulated by a parameter of the spline function.

FIG. 7 shows the dependence of the residual field R2a on the parameters d and b for the shapes of the sample container illustrated in FIG. 6. The numerical values on the contour lines designate the value of the residual field R2a in the lower partial volume V2a in ppb (parts per billion) in case that water is the sample substance and the sample container consists of borosilicate glass. The region of pairs (b, d) by means of which a residual field $R_{2a}$<30 ppb can be obtained, is marked with hatching. The points 71, 72, 73 mark those pairs (b, d) which correspond to a curve shape illustrated in FIG. 6 and meet the condition $R_{2a}$<30 ppb.

FIGS. 9a-9c show sectional views through four different rotationally symmetrical sample containers in the area of the lower end in accordance with prior art: Sample container 91 with a lens-shaped bottom (FIG. 9a), sample container 92 with constant wall thickness in accordance with (FIG. 9b) and sample container 93 with minimized field change in accordance with [8], optimized for the material combination borosilicate glass and water and inner hemispherical shape (FIG. 9c). FIG. 9d shows an inventive sample container 94 with a sample container shape (62) as in FIG. 6. The axis of rotation (Z axis) is marked with dash-dotted lines.

The sample container 92 that is available on the market is inserted with a predetermined immersion depth (in the present case 20 mm) below the coil center of the RF coil, i.e. the part of the interface G2 of the sample container 92, which is the furthest away from the sample substance in the z direction, is 20 mm below SZ. The sample container 93 in accordance with prior art [8], method 3, the sample container 91 that is available on the market and has a lens-shaped bottom, the sample container 92 and the inventive sample container 94 are arranged in the Z direction in such a fashion that the volume V or the volumes V1 and V2a have the same size for all sample containers. The residual fields R2a and R1 are listed in table 1 for $\chi_2$ of borosilicate and $\chi_3$ of water. The residual fields R1 and R2a of the inventive sample container 94 are approximately one order of magnitude smaller than those of the conventional sample containers 91, 92, which considerably improves the NMR signal quality. The inventive container 94 approximately yields the same values for R1 as the container 93 and has, however, a residual field R2a that is approximately 4 times smaller, which improves the NMR signal quality, in particular, for solvent suppression experiments.

TABLE 1 comparison of the residual fields for the sample containers in accordance with FIG. 9

| | Conventional container with lens-shaped bottom (91) | Conventional sample container with constant wall thickness (92) | Sample container (93) in accordance with prior art, method 3 [8] | Inventive sample container (94) |
|---|---|---|---|---|
| R2a | 127 ppb | 119 ppb | 50 ppb | 11 ppb |
| R1 | 0.04 ppb | 0.062 ppb | 0.01 ppb | 0.008 ppb |

The sample bottom of the inventive sample container is optimized to the corrections that are possible with a conventional shim coil system. For this reason, a considerably thinner sample bottom can be used. This is clearly shown by a comparison of the sample container 93 with the inventive sample container 94. Optimization of the sample container 94 to the corrections that are possible by means of the shim coil system produces small magnetic inhomogeneities. This improves the results, in particular, for the case of solvent suppression.

A simple example, given below, illustrates how the residual fields are generated after shimming, and how their size can be minimized through suitable selection of the geometry of the sample container.

FIGS. 10a, 10c, and 10e show the relative field changes F for the shape illustrated in FIG. 11b on the sample axis in dependence on the z position (solid line) and expansions $F_N$ of the field change in spherical coordinates up to order N=8 (dotted line) for various bottom thicknesses of the sample container. FIGS. 10b, 10d, 10f show the associated differences (F−$F^N$). The z position is stated in units of the sample container diameter D. The zero point is at the origin SZ, in which the coil center of the RF coil should be positioned in an NMR system. The relative field changes are stated in ppb.

The example is based on the following assumptions:

The center partial volume $V_1$ is located between the z positions −2.4 D and +2.4 D. The lowermost position with sample substance is located at z=−3.9 D, the lower partial volume $V_{2a}$ is therefore located between −3.9 D and −2.4 D. The borders between the partial volume areas are marked by perpendicular lines. Water having a magnetic susceptibility of −9.05 ppm is assumed to be the sample substance. The sample container consists of borosilicate and has a magnetic susceptibility of −11.0 ppm. The wall thickness of the sample container in the area where the wall extends parallel to the cylinder axis, is 0.1 D. The filling level of the sample containers is assumed to be sufficiently high (higher than 12 D), such that in this example, the influence of the bottom thickness can be discussed irrespective of the influence of field changes caused at the upper sample end.

In FIGS. 10a and 10b, the bottom thickness is d=0.1 D. In this case, the two interfaces are sufficiently close together that hardly any compensation effect on the residual field $R_{23}$ in the lower partial volume V2a can be detected. In FIGS. 10c and 10d, the bottom thickness is d=0.48 D. This selection produces the inventive configuration with minimum residual field $R_{2a}$ in the lower partial volume V2a.

The bottom thickness in FIGS. 10e and f) is d=0.8 D. This selection produces a more homogeneous field without taking into consideration the expansion in spherical functions (cf. FIG. 10e and FIG. 10c). After subtraction of the expansion $F_N$ of the field change in spherical coordinates, the field in the volume $V_{2a}$ becomes more inhomogeneous (cf. FIG. 10f and FIG. 10d). FIG. 10e and FIG. 10f correspond to geometries that are obtained using the method disclosed in [8], namely through minimizing the relative field change F in the overall volume. Within the scope of the present invention, it has turned out that the desire to minimize the field change F in the overall volume in combination with shimming, results in overcompensation.

A comparison of the numerical values for the residual fields calculated in the partial volumes V1 and V2a for the three discussed bottom thicknesses is illustrated in the following table:

TABLE 2

Comparison of the residual fields for the sample containers in accordance with FIG. 10

|  | d = 0.1 D | d = 0.48 D | d = 0.8 D |
| --- | --- | --- | --- |
| R2a | 361 ppb | 13.6 ppb | 90 ppb |
| R1 | 0.039 ppb | 0.0053 ppb | 0.0039 ppb |

The dependence of the residual field R2a on the ratio d/D was similarly calculated with finer resolution. The overall dependence is illustrated in FIG. 11a. This curve shows that it is possible to obtain a residual field R2a in the lower partial volume, which is smaller than 30 ppb, in a range between d=0.42 D and d=0.53 D around the minimum.

The influence of adjustments of the contours by rounding radii or ellipsoidal shape of the contours is illustrated by way of example in FIGS. 12 and 13.

The inventive combination of the geometrical optimization of the sample container with a (simulated) shimming process in the form of an expansion of the relative field change in spherical coordinates is more efficient and produces better results than the conventional sample containers. The inventive method permits design of the field inhomogeneity, which is unavoidably generated by the borders of the sample volume V, in such a fashion that the essential part can be expanded in rotationally symmetrical spherical coordinates. This part can be "shimmed away" and therefore has no negative influence on the signal quality. The remaining residual fields R1, R2a, R2b are controlled by the present optimization method, thereby obtaining the required signal quality.

LIST OF REFERENCE NUMERALS

1 environment of the sample container
2 sample container
3 liquid sample substance
4 RF coil that is suited to excite the spin system of the sample substance and to receive an NMR signal, and the center of which is positioned at SZ
5 magnet for generating a strong static magnetic field $B_0$
6 shim coil system, the center of which is positioned at SZ
41 sealing element that can be inserted through the open end of the sample container and be brought into contact with the sample substance
61 inner contour corresponding to parametrization b=−0.6 and d=0.5 D
62 inner contour corresponding to parametrization b=−0.4 and d=0.5 D
63 inner contour corresponding to parametrization b=−0.2 and d=0.5 D
71 point in the region 74, which corresponds to the inner contour that is parametrized by b=−0.6 and d=0.5 D
72 point in the region 74, which corresponds to the inner contour that is parametrized by b=−0.4 and d=0.5 D
73 point in the region 74, which corresponds to the inner contour that is parametrized by b=−0.2 and d=0.5 D
74 region that comprises pairs (b, d) that can achieve a residual field $R_{2a}$<30 ppb
$B_0$ static homogeneous magnetic field
$\chi_1$ Susceptibility of the environment (typically air or nitrogen)
$\chi_2$ Susceptibility of the sample container (typically glass)
$\chi_3$ Susceptibility of the sample substance (e.g. water)
b Parameter that can be used to influence the shape of a curvature in the form of an elevation or a depression in the inner contour of the sample
d maximum thickness of the bottom of the sample substance container measured on the z axis
D outer diameter of the sample substance container
G1 interface between the environment and the sample container
G2 interface between sample container and sample substance
G3 interface between sample substance and environment
SZ origin of the spherical coordinate system in which the relative field change is expanded. The spherical coordinate system comprises a z axis that represents the axis of rotation of the sample container
V overall volume of the sample substance ($V=V_1+V_{2a}-V_{2b}$)
$V_1$ center partial volume
Active sample substance volume in an NMR system (=partial volume of v, in which the RF field of the coil is at least larger than 50% of the maximum RF field)
$V_{2a}$ lower partial volume of V (at the lower end of V and adjacent to $V_1$)
$V_{2b}$ upper partial volume of V (at the upper end of V and adjacent to $V_1$)

LIST OF REFERENCES

[1] F. Romeo and D. I. Hoult, "Magnetic Field Profiling and Correcting Coil Design" Magn. Reson. Med. 1, 44-65 (1984)
[2] R. R. Ernst, "Measurement and Control of Magnetic Field Homogeneity", Rev. Sci. Instrum. 39, 998-1012 (1968)

[3] Van Zijl PCM, Sukumar S, Johnson M, Webb P, Hurd RE., "Optimized shimming for high-resolution NMR using three-dimensional image-based field mapping", JMR A 111, 203-207 (1994)

[4] M. Weiger, T. Speck, M. Fey, "Gradient shimming with spectrum optimisation", J Magn Reson. 182(1), 38-48, (2006)

[5] U.S. Pat. No. 4,549,136

[6] U.S. Pat. No. 5,831,434

[7] J. C. Maxwell, A Treatise on Electricity and Magnetism, Dover Publications, New York, 1954, third edition, Vol. 2, pp. 66-70.

[8] EP 1 918 731 A1.

[9] I. N. Bronstein, K. A. Semendjajew, Taschenbuch der Mathematik (Manual of mathematics), BSB Teubner, Leipzig, 1989.

[10] U.S. Pat. No. 3,287,630

We claim:

1. A sample container for NMR measurements, the sample container being closed on one side thereof, the NMR measurements performed by disposing the sample container in an environment, having a magnetic susceptibility $\chi_1$, within an external homogeneous magnetic field $B_0$, the external homogeneous magnetic field $B_0$ extending parallel to a z axis, the sample container being structured to hold a sample substance occupying a volume V within the sample container and having a magnetic susceptibility $\chi_3$, the sample container comprising:
   a first wall structure defining an upper partial volume V2b of the sample substance;
   a second wall structure defining a lower partial volume V2a of the sample substance;
   a third wall structure defining a center partial volume V1 of the sample substance, said first second and third wall structures being made from a material having a magnetic susceptibility of $\chi_2$, the center partial volume having an origin SZ of a spherical coordinate system having the z-axis, wherein the upper, lower and center partial volumes adjoin one another;
   a fourth wall structure defining a first interface G1 facing the environment, the first interface having a first susceptibility jump generating a first location-dependent disturbance field $B_{G1}$; and
   a fifth wall structure defining a second interface G2 facing the sample substance, the second interface having a second susceptibility jump generating a second location-dependent disturbance field $B_{G2}$, wherein the sample substance defines a third interface G3 between the sample substance and the environment, the third interface having a third magnetic susceptibility jump generating a third location-dependent disturbance field $B_{G3}$, wherein the second susceptibility jump is sufficiently large that a maximum value of $|B'_{G2}/B_0|$ within the volume V is at least 0.5 ppm, a first residual field R1 being present in the center partial volume V1 and a second residual field R2a in the lower partial volume V2a, wherein a geometry of the sample container is thereby selected in such a fashion that a location-dependent relative field change F is present in the volume V due to the first, second and third susceptibility jumps, wherein, at least at one point in the center partial volume V1, a relative field change F is larger than 20 ppb, the first residual field R1 being smaller than 1.6 ppb and the second residual field R2a being smaller than 30 ppb, wherein:

$B_{G1}$: is a location-dependent z component of the magnetic field that is generated in the volume V due to the first susceptibility jump from $\chi_1$ to $\chi_2$ at the first interface G1;

$B_{G2}$: is a location-dependent z component of the magnetic field that is generated in the volume V due to the second susceptibility jump from $\chi_2$ to $\chi_3$ at the second interface G2;

$B_{G3}$: is a location-dependent z component of the magnetic field that is generated in the volume V due to the third susceptibility jump from $\chi_3$ to $\chi_1$ at the third interface G3;

$F := (B'_{G1} + B'_{G2} + B'_{G3})/B_0$: is a location-dependent relative field change due to the first, second and third susceptibility jumps;

$B'_j := B_j - \langle B_j \rangle$: is a location-dependent deviation of a field $B_j$ from an average value $\langle B_j \rangle$ $\langle B_j \rangle$: is an average value of the z component of the field $B_j$, wherein j=G1, G2, G3;

$$R_1 := \left( \frac{1}{V_1} \int_{V_1} (F - F^N)^2 \, dV \right)^{1/2},$$

is the first residual field in the center partial volume V1;

$$R_{2a} := \left( \frac{1}{V_{2a}} \int_{V_{2a}} (F - F^N)^2 \, dV \right)^{1/2},$$

is the second residual field in the lower partial volume V2a; and $F^N$: is an expansion of the relative field change F about the origin SZ in rotationally symmetrical spherical functions up to order N, wherein N=4 to 10; with $$\langle A \rangle := \frac{1}{V} \int_V A \cdot dV:$$

being an average value of any magnetic field A in the sample volume V; and $$A^N := \sum_{n=0}^{N} a_n K_n(r, \theta):$$

an expansion of A in rotationally symmetrical spherical functions up to order N, wherein $a_n$: are expansion coefficients $K_n(r,\theta) = r^n P_n(\cos \theta)$: are rotationally symmetrical spherical functions and $P_n(\cos \theta)$: are Legendre polynomials.

2. The sample container of claim 1, wherein the geometry of the sample container is selected in such a fashion that, when the homogeneous magnetic field $B_0$ has been applied, the following applies for a third residual field R2b in the upper partial volume V2b:

$R_{2b} \leq 30$ ppb, wherein $$R_{2b} := \left(\frac{1}{V_{2b}} \int_{V_{2b}} (F - F^N)^2 \, dV\right)^{1/2}$$

is the third residual field in the upper partial volume V2b.

3. The sample container of claim 1, wherein the sample container is rotationally symmetrical with respect to the z axis.

4. The sample container of claim 1, wherein the sample container is made from a material whose magnetic susceptibility $\chi_2$ has a higher value than a magnetic susceptibility $\chi_3$ of the sample substance.

5. The sample container of claim 1, wherein the sample container consists essentially of glass, of borosilicate glass or of quartz glass.

6. The sample container of claim 1, wherein magnetic susceptibility $\chi_3$ of the sample substance is within a susceptibility interval of water and acetone.

7. The sample container of claim 1, wherein the environment consists essentially of air and nitrogen.

8. The sample container of claim 3, wherein the sample container is a circular cylindrical tube having a bottom and a cylindrical lateral surface, wherein said bottom and said cylindrical lateral surface each have an inner surface and an outer surface.

9. The sample container of claim 8, wherein an extension of the upper partial volume V2b and/or of the lower partial volume V2a is smaller in a direction of the z axis than a diameter of the sample container.

10. The sample container of claim 8, wherein a maximum thickness of said bottom of said tube is 0.4 to 0.6 times an outer tube diameter.

11. The sample container of claim 9, wherein both said inner surface and said outer surface of said bottom of said tube are formed by a flat end, perpendicular to the z axis.

12. The sample container of claim 9, wherein a contour of said inner surface of said tube bottom is described by a curve having a central curvature.

13. The sample container of claim 9, wherein an outer contour of said tube is formed by a flat bottom in a center area close to an axis of rotation and a rounding radius at a transition between said bottom and said cylindrical lateral surface.

14. The sample container of claim 9, wherein an outer contour of said tube at said tube bottom is formed by one half of an ellipsoid of revolution, a shortest semi-axis of which lies in a direction of a tube axis.

15. The sample container of claim 9, wherein the sample container comprises a sealing element which is formed in such a fashion that it can be inserted from an open end after filling in the sample substance and can be brought into direct contact with the sample substance.

16. A method for producing the sample container of claim 1, the method comprising the following steps, executed in sequence:
   a) defining susceptibilities $\chi_1, \chi_2, \chi_3$ of the environment, of the material of the sample container and of the sample substance as well as a maximum order N for an expansion of the relative field change F in rotationally symmetrical spherical functions and an admissible upper limit for the first residual field R1 and for the second residual field R2a;
   b) determining a parameterized contour in a spherical coordinate system by defining a constant part of the sample container having a shape that shall remain unchanged, a dimension and position of the center partial volume V1 of the sample substance within the constant part of the sample container and one or more geometrical shapes and/or functions that continue the defined constant part of the shape to form a complete sample container;
   c) determining parameters that describe dimensions of the geometrical shapes and/or functions selected in step b);
   d) establishing a contour of the sample container through selection of a value for each parameter;
   e) defining grid of points in the spherical coordinate system and allocating grid points to the upper V2b, lower V2a and center V1 partial volumes;
   f) calculating a relative field change caused through application of the external homogeneous magnetic field at the grid points;
   g) expanding the relative field change F in rotationally symmetrical spherical functions up to order N about the origin SZ of the spherical coordinate system, wherein N=4 to 10;
   h) calculating the first residual field R1 and the second residual field R2a; and
   i) if at least one of defined upper limits for residual fields R1 or R2a is exceeded, repeating steps d)-i), wherein at least one parameter value is changed until a combination of parameter values has been found that does not exceed any of the defined upper limits for the residual fields R1 and R2a.

17. The method of claim 16, wherein the geometry of the sample container is selected in such a fashion that, when the homogeneous magnetic field $B_0$ has been applied, a third residual field R2b is present in the upper partial volume V2b, wherein $$R_{2b} := \left(\frac{1}{V_{2b}} \int_{V_{2b}} (F - F^N)^2 \, dV\right)^{1/2}$$

and step a) additionally defines an admissible upper limit for the third residual field Rb2, with the third residual field R2b being calculated in step h), wherein steps d)-i) are repeated in case defined upper limits for the residual field R2b is exceeded, wherein at least one parameter value is changed until a combination of parameter values has been found that does not exceed any of the defined upper limits for residual fields R1, R2a, and R2b.

18. A method for producing the sample container of claim 1, the method comprising the following steps, executed in sequence:
   a) defining susceptibilities $\chi_1, \chi_2, \chi_3$ of the environment, of the material of the sample container and of the sample substance as well as a maximum order N for an expansion of the relative field change F in rotationally symmetrical spherical functions;
   b) determining a parameterized starting contour in a spherical coordinate system by defining a constant part of the sample container having a shape that shall remain unchanged as well as a position and dimension of the center partial volume V1 of the sample substance within the constant part of the sample container and one or more geometrical shapes and/or functions that continue the defined constant part of the shape to form a complete sample container;
   c) determining parameters that describe dimensions of the geometrical shapes and/or functions determined in step b);

d) establishing a contour of the sample container through selection of a value for each parameter;
e) defining a grid of points in the spherical coordinate system and allocating grid points to the partial volumes V1, V2a and V2b;
f) calculating relative field changes caused through application of the external homogeneous magnetic field at the grid points;
g) expanding the relative field changes F in rotationally symmetrical spherical functions up to an order N about the origin SZ of the spherical coordinate system, wherein N=4 to 10;
h) calculating the first residual field R1, the second residual field R2a and the third residual field R2b;
i) defining a cost function $f=-w_1*R_1-w_{2a}*R_{2a}-w_{2b}*R_{2b}$, wherein $0 \leq w_1 \leq 1$, $0 \leq w_{2a} \leq 1$ and $0 \leq w_{2b} \leq 1$; and
j) applying a numerical optimization algorithm for determining a set of parameter values which define a minimum of the cost function f, wherein steps d) to j) are performed with parameter values determined in this fashion until an optimum of the cost function f is obtained.

* * * * *